(12) United States Patent
Summerson et al.

(10) Patent No.: US 9,179,362 B2
(45) Date of Patent: *Nov. 3, 2015

(54) SYSTEMS AND METHODS FOR NETWORKING CODING USING REED-SOLOMON CODES

(75) Inventors: Samantha Rose Summerson, Houston, TX (US); Anuj Batra, Dallas, TX (US); Srinath Hosur, Plano, TX (US); Georgios Angelopoulos, Cambridge, MD (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 318 days.

This patent is subject to a terminal disclaimer.

(21) Appl. No.: 13/595,774

(22) Filed: Aug. 27, 2012

(65) Prior Publication Data

US 2013/0170433 A1    Jul. 4, 2013

Related U.S. Application Data

(60) Provisional application No. 61/527,188, filed on Aug. 25, 2011.

(51) Int. Cl.
*H04W 4/00* (2009.01)
*H04W 28/06* (2009.01)
*H04L 1/00* (2006.01)
*H03M 13/15* (2006.01)
*H03M 13/37* (2006.01)

(52) U.S. Cl.
CPC ........ *H04W 28/065* (2013.01); *H03M 13/1515* (2013.01); *H03M 13/373* (2013.01); *H03M 13/3761* (2013.01); *H04L 1/0057* (2013.01)

(58) Field of Classification Search
CPC ............ H03M 13/1515; H03M 13/373; H04L 1/0041; H04L 1/0005
USPC ................................... 370/328, 394; 714/776
See application file for complete search history.

(56) References Cited

U.S. PATENT DOCUMENTS

| 5,278,846 | A  | 1/1994  | Okayama et al. |         |
|-----------|----|---------|----------------|---------|
| 8,185,811 | B2 | 5/2012  | Li et al.      |         |
| 2002/0006138 | A1 | 1/2002 | Odenwalder |         |
| 2002/0172292 | A1 | 11/2002 | Gray |         |
| 2003/0093741 | A1 | 5/2003 | Argon et al. |         |
| 2004/0025102 | A1 | 2/2004 | Yokokawa |         |
| 2007/0097980 | A1* | 5/2007 | Kalhan et al. ................. | 370/394 |
| 2009/0300469 | A1 | 12/2009 | Rajakarunanayake |         |
| 2010/0153822 | A1* | 6/2010 | Huang et al. .................. | 714/776 |
| 2010/0201398 | A1 | 8/2010 | Zhao et al. |         |
| 2010/0205510 | A1 | 8/2010 | von der Embse |         |
| 2012/0110420 | A1* | 5/2012 | Lin et al. ........................ | 714/776 |
| 2012/0151295 | A1 | 6/2012 | Neeman et al. |         |
| 2012/0236763 | A1 | 9/2012 | Lucani et al. |         |
| 2013/0297994 | A1 | 11/2013 | Eroz et al. |         |

* cited by examiner

*Primary Examiner* — Dang Ton
*Assistant Examiner* — Lionel Preval
(74) *Attorney, Agent, or Firm* — Steven A. Shaw; Charles A. Brill; Frank D. Cimino

(57) ABSTRACT

A method for network coding includes encoding a plurality of message packets to produce a plurality of encoded packets. Each message packet and each encoded packet includes a plurality of symbols having an index and each symbol of the encoded packets is generated by applying a Reed-Solomon code to the symbols of the message packets having the same index as the symbol of the encoded packets. A length of the encoded packets is the same as a length of the message packets.

17 Claims, 3 Drawing Sheets $$X = \begin{bmatrix} p_{1,1} & p_{1,2} & \cdots & p_{1,K} \\ p_{2,1} & p_{2,2} & \cdots & p_{2,K} \\ \vdots & \vdots & \cdots & \vdots \\ p_{L,1} & p_{L,2} & \cdots & p_{L,K} \end{bmatrix} \quad A = \begin{bmatrix} a_{1,1} & a_{1,2} & \cdots & a_{1,N} \\ a_{2,1} & a_{2,2} & \cdots & a_{2,N} \\ \vdots & \vdots & \cdots & \vdots \\ a_{K,1} & a_{K,2} & \cdots & a_{K,N} \end{bmatrix} \quad Y = \begin{bmatrix} y_{1,1} & y_{1,2} & \cdots & y_{1,N} \\ y_{2,1} & y_{2,2} & \cdots & y_{2,N} \\ \vdots & \vdots & \cdots & \vdots \\ y_{L,1} & y_{L,2} & \cdots & y_{L,N} \end{bmatrix}$$

FIG. 2a $$R = \begin{bmatrix} r_{1,1} & r_{1,2} & \cdots & r_{1,M} \\ r_{2,1} & r_{2,2} & \cdots & r_{2,M} \\ \vdots & \vdots & \cdots & \vdots \\ r_{L,1} & r_{L,2} & \cdots & r_{L,M} \end{bmatrix} \quad A' = \begin{bmatrix} a'_{1,1} & a'_{1,2} & \cdots & a'_{1,K} \\ a'_{2,1} & a'_{2,2} & \cdots & a'_{2,K} \\ \vdots & \vdots & \cdots & \vdots \\ a'_{K,1} & a'_{K,2} & \cdots & a'_{K,K} \end{bmatrix} \quad X' = \begin{bmatrix} p_{1,1} & p_{1,2} & \cdots & p_{1,K} \\ p_{2,1} & p_{2,2} & \cdots & p_{2,K} \\ \vdots & \vdots & \cdots & \vdots \\ p_{L,1} & p_{L,2} & \cdots & p_{L,K} \end{bmatrix}$$

FIG. 2b

SYSTEMS AND METHODS FOR NETWORKING CODING USING REED-SOLOMON CODES

CROSS-REFERENCE TO RELATED APPLICATION

The present application claims priority to U.S. Provisional Patent Application No. 61/527,188 filed on Aug. 26, 2011; Ser. Nos. 13/595,862, 13/595,894, 13/596,000, and 13/596,005, now U.S. Pat. No. 8,839,085. All related applications were filed on Aug. 27, 2012.

BACKGROUND

In wireless networks, the ability to correctly receive data packets with increased reliability is important. Typically, if a packet is lost in transmission, the intended recipient requests that the sender retransmit the packet. However, certain systems that utilize a wireless network may require a very low packet loss and retransmission rate, for example where the data being transmitted via the wireless network is critical to the safety or performance of the system. In these systems, packet loss leading to requests for retransmission is unacceptable.

Network coding is a technique that can be used to improve the capacity and efficiency of network transmissions. Network coding functions by transmitting an encoded function of the data bits rather than the original data bits; subsequently, the function of the data bits is decoded to obtain the original data bits. Transmitting functions of the data bits in this manner can reduce the average number of transmissions needed for a given amount of information, which reduces the number of retransmissions needed if there are bit errors or erasures.

Applying a network code to the bits of a packet results in a greater number of bits than originally contained in the packet. Although the extra bits that result from the application of the network code enable the recipient to successfully decode and recover the original bits if the packet is received, if a packet is lost during transmission, the packet must be retransmitted.

SUMMARY

The problems noted above are solved in large part by embodiments directed to a method for network coding that includes encoding a plurality message packets to produce a plurality of encoded packets, for example that include the message packets and one or more parity packets. Each message packet and each encoded packet includes a plurality of symbols having an index and each symbol of the encoded packets is generated by applying a Reed-Solomon code to the symbols of the message packets having the same index as the symbol of the encoded packets. A length of the encoded packets is the same as a length of the message packets.

Other embodiments are directed to a non-transitory computer-readable medium containing instructions that, when executed by a processor, cause the processor to encode a plurality of message packets to produce a plurality of encoded packets. Each message packet and each encoded packet includes a plurality of symbols having an index and each symbol of the encoded packets is generated by applying a Reed-Solomon code to the symbols of the message packets having the same index as the symbol of the encoded packets.

Still other embodiments are directed to a wireless communication device, including a network encoder and a physical layer. The network encoder is to encode a plurality of message packets to produce a plurality of encoded packets. Each message packet and each encoded packet includes a plurality of symbols having an index and each symbol of the encoded packets is generated by applying a Reed-Solomon code to the symbols of the message packets having the same index as the symbol of the encoded packets. The physical layer is to transmit the encoded packets via a wireless antenna.

Yet other embodiments are directed to a wireless communication device, including a physical layer to receive a plurality of encoded packets via a wireless antenna, the encoded packets resulting from encoding a number of message packets by applying a network code matrix to the message packets. The wireless communication device also includes a network decoder to receive a number of received packets at least equal to the number of message packets. Each of the received packets includes a sequence index that correlates the received packet to one of the encoded packets. The network decoder also is to generate a received packet matrix by selecting a number of the received packets equal to the number of message packets, where each column of the received packet matrix corresponds to one of the selected received packets. The network decoder further is to generate a decoding matrix by forming a sub-matrix by selecting columns of the network code matrix that have indices that are the same as the sequence indices of the selected received packets and inverting the sub-matrix. Finally, the network decoder is to multiply the received packet matrix by the decoding matrix to generate a recovered matrix, where each column of the recovered matrix corresponds to a decoded packet.

BRIEF DESCRIPTION OF THE DRAWINGS

For a detailed description of exemplary embodiments of the invention, reference will now be made to the accompanying drawings in which:

Figure 1:
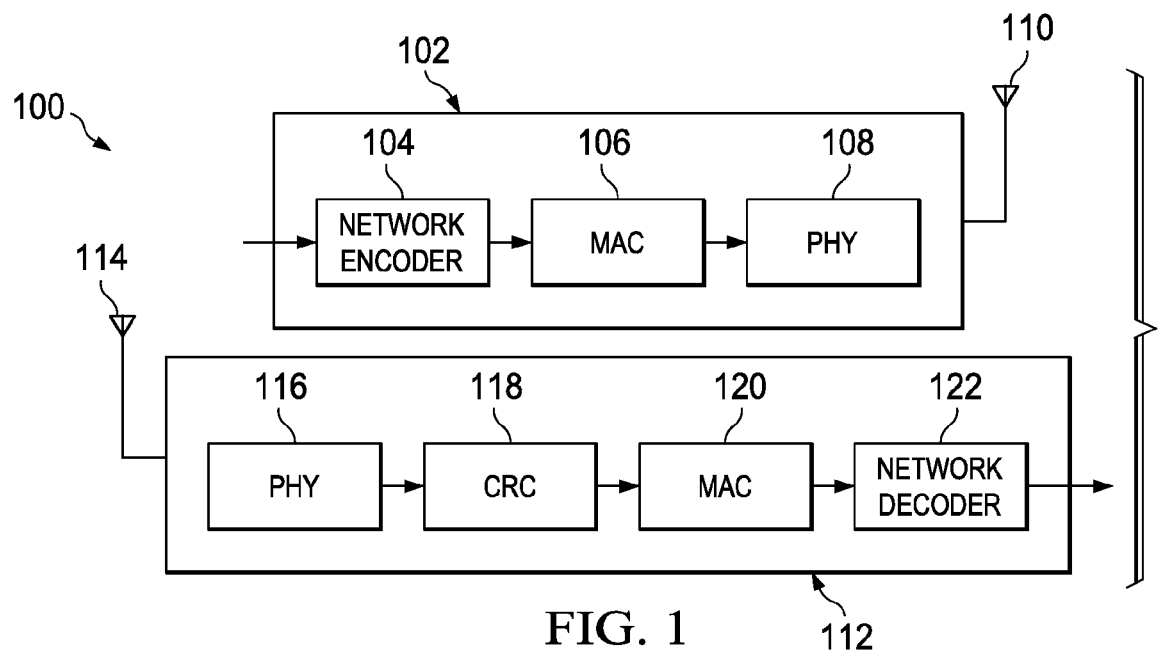
Figure 3:
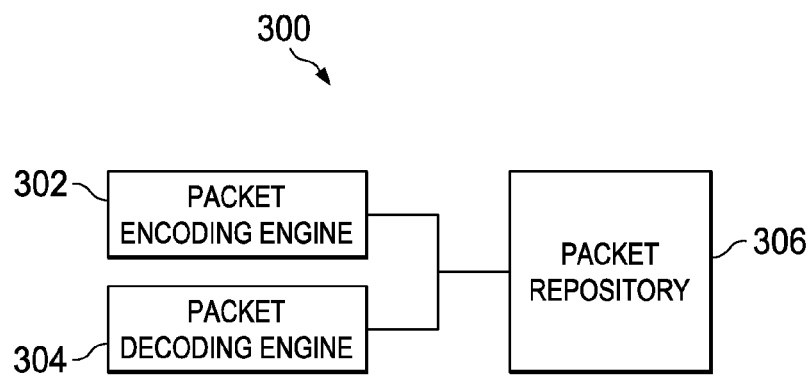
Figure 4:
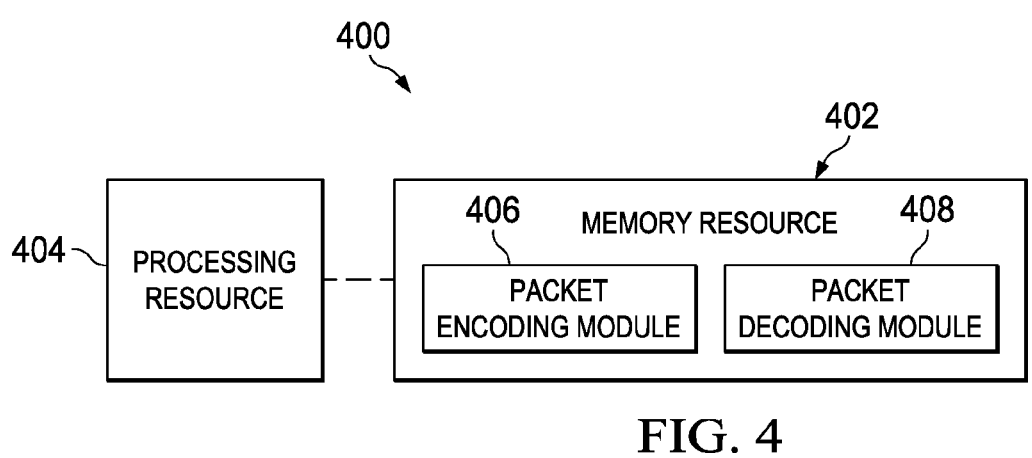
Figures 5A, 5B:
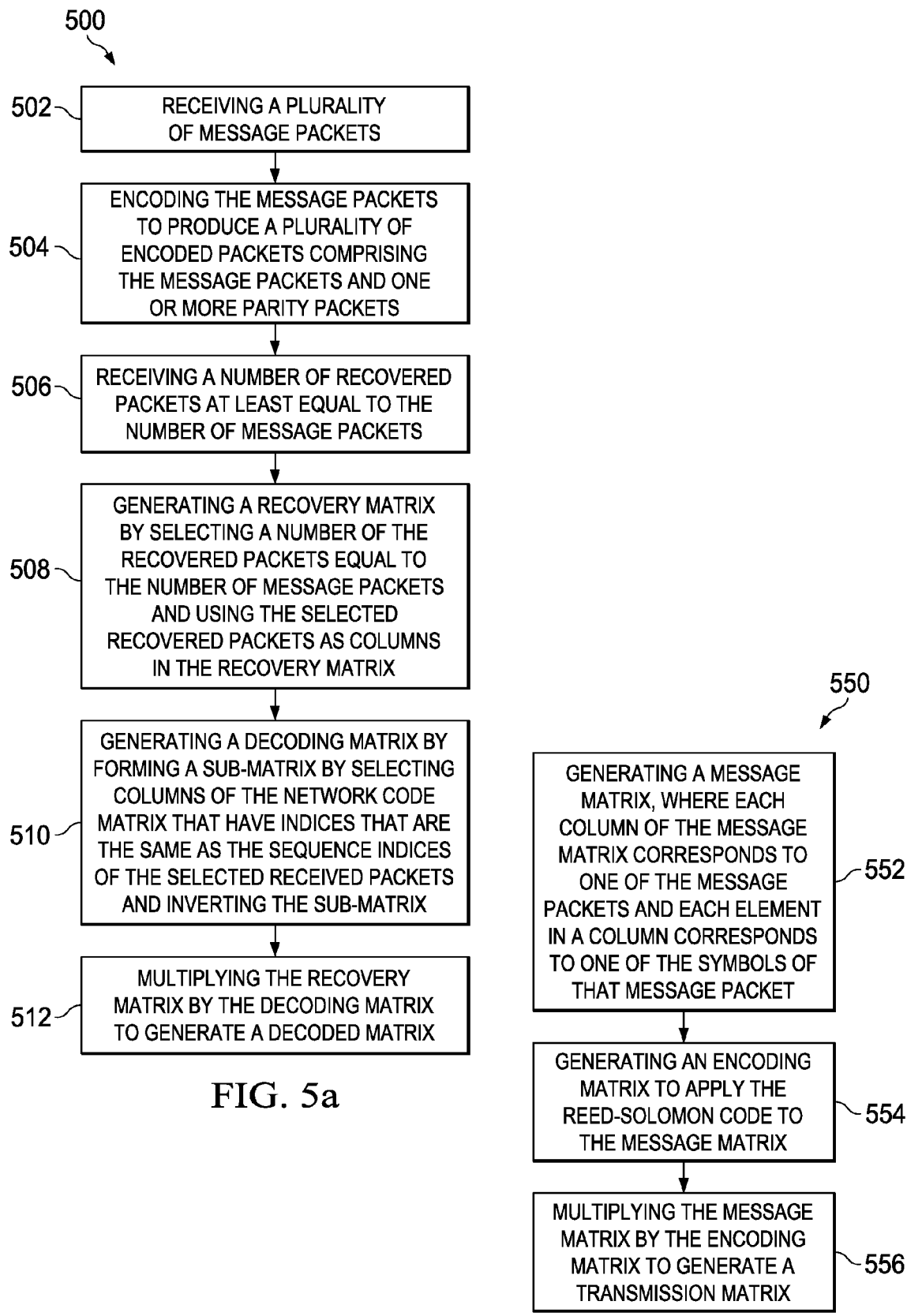

Having thus described the invention in general terms, reference will now be made to the accompanying drawings, which are not necessarily drawn to scale, and wherein:

FIG. 1 shows a wireless communications system in accordance with various embodiments;

FIGS. 2a and 2b show examples matrices used for network coding in accordance with various embodiments;

FIG. 3 shows a network coding system in accordance with various embodiments;

FIG. 4 shows an alternate network coding system in accordance with various embodiments; and FIGS. 5a and 5b show flow charts of a method in accordance with various embodiments.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

As used herein, the term "symbol" refers to a grouping of bits, which exists in a Galois field (GF) of $GF(2^q)$, where q bits are grouped into a symbol.

As used herein, the term "message packet" refers to packets that contain data to be transmitted from one node to another node in a wireless network.

As used herein, the term "encoded packet" refers to packets that result from encoding a group of message packets according to the various embodiments of the present disclosure.

As used herein, the term "parity packet" refers to additional packets produced during a packet encoding procedure. For example, if the application of a network code to message packets results in encoded packets that comprise the original message packets and two additional packets, the two additional packets are referred to as parity packets.

As used herein, the term "coding rate" refers to the ratio of message packets to encoded packets. For example, if five encoded packets are produced by encoding three message packets, the coding rate is 3/5. Similarly, if seven encoded packets are produced by encoding five message packets, the coding rate is 5/7.

As used herein, the term "erasure packet" or "erasure signal" refers to an indication sent to a decoder at a recipient when a packet failure occurs during transmission of one of the encoded packets (e.g., bit errors or a cyclic redundancy check (CRC) failure are detected that occurred during transmission of the encoded packet).

As used herein, the term "received packet" refers to packets successfully received by a decoder at a recipient. For example, if five encoded packets are transmitted and one packet failure occurs, the decoder receives four received packets and one erasure packet or signal.

As used herein, the term "recovered packet" or "decoded packet" refers to packets that result from decoding a group of received packets according to the various embodiments of the present disclosure.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As explained above, a message packet containing data in the form of bits or symbols is typically encoded by applying network codes to the bits or symbols of the message packet to provide redundancy and data recovery ability in the event that certain bits or symbols of the encoded packet are lost during transmission. This may reduce the average number of transmissions needed for a given amount of information, which subsequently reduces the number of retransmissions in the event of an error or packet erasure. However, if an entire packet is lost during transmission, the packet must be retransmitted.

The network code should use the smallest Galois or finite field that allows for the matrix containing the code (i.e., a network code matrix) to be inverted. Using a small finite field also helps to minimize implementation complexity at both the transmitter and receiver. In addition, the network code should be maximum distance separable (MDS), which means that if K or more packets are received correctly, then the original K packets can be decoded correctly.

In accordance with various embodiments, a network code, in particular a Reed-Solomon code, is applied to multiple message packets to produce encoded packets that are of the same length as the message packets. A Reed-Solomon code is a linear block code over a finite field $GF(2^q)$, where $q=\log_2(N+1)$. In general, a Reed-Solomon code defined by its coding rate, K/N, can correct N−K symbol erasures. Since the Reed-Solomon can correct N−K symbol erasures, as long as K or more transmission packets are received correctly, the message or original packets can be recovered. Thus, the Reed-Solomon code is also an MDS code.

To take advantage of time diversity in the system and increase reliability, the Reed-Solomon code is applied cross a plurality of message packets to produce a larger number of encoded packets. The network encoder may assume that the message packets are of the same size. The output of the network encoder is encoded packets that are of the same size as the message packets. The resulting encoded packets may then be transmitted using an existing underlying wireless communication protocol without modification.

The number of encoded packets produced is greater than the number of message packets and, depending on the particular network code, the original message packets can be successfully recovered (i.e., decoded) provided that the number of received packets at the decoder is at least equal to the number of message packets. Thus, some packets may be lost during transmission (i.e., no more than the difference between the number of encoded packets and number of message packets) without requiring a retransmission of the message packets because all the message packets are able to be successfully recovered.

In situations where high packet transmission reliability is required, the application of such a network code provides numerous advantages. For example, a packet error rate (PER) of the system or wireless channel may be experimentally determined and the network code may be chosen such that the PER is less than the fraction of packets that can be lost in transmission while still maintaining the ability to recover or decode the original message packets. Additionally, by making the network code known to both the transmitter and the receiver rather than using a random code, the network code does not have to be transmitted along with various packets, which reduces the overhead and increases the throughput of the system. Further, the inverse of the network code (i.e., to decode the received packets) does not need to be calculated on-the-fly because the network code is known to the receiver, which reduces software and hardware complexity and computational requirements. Finally, as explained above, the way in which the network code is applied to message packets results in encoded packets that have the same length as the message packets. In accordance with the various examples of the present disclosure, network coding may be leveraged on top of existing wireless communications protocols without the need to redesign other aspects of the system.

Turning now to FIG. 1, a wireless communications system 100 is shown in accordance with various embodiments. The system 100 includes a transmitter 102 and a receiver 112. Although the transmitter 102 and receiver 112 are shown separately, this is for simplicity of explanation and one skilled in the art appreciates that the functionality of both the transmitter 102 and the receiver 112 may be embodied in a single wireless transceiver that communicates with other wireless transceivers. The transmitter includes at least a network encoder 106, a medium access control (MAC) layer 106 and a physical layer (PHY) 108. The MAC 106 and the PHY 108 coordinate to enable wireless communications (e.g., transmitting and receiving data packets) via a wireless antenna 110. Similarly, the receiver 112 includes at least a PHY 116, a cyclic redundancy check (CRC) error-detecting block 118, a MAC 120 and a network decoder 122. As above, the MAC 120, the CRC 118 and the PHY 116 coordinate to enable wireless communications via a wireless antenna 114. In some embodiments, the CRC 118 may be replaced or supplemented by a different type of packet error-detecting block.

In accordance with various embodiments, the network encoder 104 receives message packets containing data to be transmitted from, for example, a higher-layer application executing on the transmitter 102. The network encoder 104 also encodes the message packets to produce a number of encoded packets greater than the number of message packets. As explained above, the length of the message packets is preserved when encoded to produce the encoded packets, and thus the encoded packets are suitable for transmission by the PHY 108 using an underlying wireless communication protocol of the transmitter 102. In accordance with various embodiments, the network encoder 104 encodes the message packets by applying a Reed-Solomon code to corresponding symbols of the message packets to produce a corresponding symbol in the parity packets. Subsequently, the encoded packets may be sent to the PHY 108 (e.g., via the MAC 106) for wireless transmission.

FIG. 2a shows a message matrix X, a network code matrix A, and a transmission matrix Y to illustrate the functionality of the network encoder 104 in further detail. The message matrix X contains K message packets, where each column in X represents a message packet; that is, the elements of a column correspond to symbols or bits of a message packet. As shown, the message matrix X contains L rows, which is the length of the message packets.

The network code matrix A describes a Reed-Solomon (N, K) network code. That is, when the message matrix X is multiplied by the network code matrix A, a Reed-Solomon (N, K) network code is applied to the K message packets contained in the message matrix X to produce N encoded packets in the transmission matrix Y. In some embodiments, the first K columns of the network code matrix A comprise a K×K identity matrix (i.e., $a_{1,1}=a_{2,2}=\ldots=a_{K,K}=1$ and all other elements in those columns are 0) and columns K+1 through N describe the Reed-Solomon (N, K) code. As a result, when the message matrix X is multiplied by the network code matrix A, the Reed-Solomon (N, K) code is applied across each row of the message matrix X to produce N−K parity symbols. In other words, the Reed-Solomon (N, K) code is applied across packets, instead of within a packet, resulting in encoded packets of the same length as the original K message packets.

The network code matrix A must be a full rank matrix in order to ensure that any K linear combinations of encoded packets are linearly independent and therefore can be inverted at the receiver 112. Additionally, the number of linearly independent combinations of packets is dependent on the size of the finite field. For a small size finite field, the number of linearly independent combinations is small. For a large size finite field, the number of linearly independent combinations is large. Thus, depending on system requirements (e.g., packet error rate), a larger finite field may be selected to enable the use of a Reed-Solomon code where N is much larger than K.

As an example of the encoding process for a systematic code, the first K columns of the transmission matrix Y are equal to the message matrix X. Additionally, symbols in a given row of columns K+1 through N of the transmission matrix Y (i.e., the columns of the transmission matrix Y that correspond to the parity packets produced by the application of the Reed-Solomon (N, K) code to the message packets) are produced by applying the Reed-Solomon (N, K) code to that same row of the message matrix X.

As another example, assume a Reed-Solomon (7, 5) code is used. The Reed-Solomon (7,5) code is applied to the rows of the message matrix X to generate the rows of the transmission matrix Y. The first 5 columns of the transmission matrix Y are equal to the message matrix X. Each row of the message matrix X and the transmission matrix Y may be described as representing a symbol of a packet because the columns of both matrices represent the packets themselves. The rows or symbols may be referred to as having an index; for example, the first row of each matrix has an index of 1 and the last row of each matrix has an index of L. Thus, the transmission matrix Y contains N transmission packets each having a length L, which is the same length as the message packets in the message matrix X and the underlying wireless communication protocol employed by the PHY 108 (e.g., on an existing wireless communication device) is capable of transmitting the N transmission packets.

Referring again to FIG. 1, the PHY 116 of the receiver 112 receives the transmission packets and passes the transmission packets to the CRC 118 for error checking. Typically, all N transmission packets are received; however, in some cases, certain packets may never be received. As will be explained in further detail below, a sequence number or index may be applied to each received packet (e.g., by being transmitted with the packet) that identifies the column of the transmission matrix Y that the received packet corresponds to.

Some transmission packets may not pass the CRC 118, meaning that those packets contain one or more errors and are considered erasures. In some embodiments, the CRC 118 may generate an erasure packet or erasure signal to be sent to the network decoder 122 (e.g., via the MAC 120) to inform the network decoder 122 of the transmission packets that were not received successfully. The transmission packets that do pass the CRC 118 (i.e., contain no errors) are referred to as received packets and are sent to the network decoder 122. A Reed-Solomon (N, K) code can correct N−K erasures, so provided that there are no more than N−K erasures detected by the CRC 118, the network decoder 122 is able to decode the original K message packets.

FIG. 2b shows a matrix R that includes M received packets, a decoding matrix A' and a recovered matrix X' to illustrate the functionality of the network decoder 122 in further detail. Although the matrix R is shown as having M columns each corresponding to a received packet, in accordance with various embodiments a received packet matrix is generated that contains a number of received packets equal to the number of original message packets, namely K. The selection of received packets may take many forms, provided that K received packets are selected to make up the columns of the received packet matrix. As explained above, a Reed-Solomon (N, K) code can correct N−K erasures, so provided that M is greater than K, the network decoder 122 is able to decode the original K message packets. Additionally, as will be explained in further detail below, the decoding matrix A' is a K×K matrix, and thus the received packet matrix also contains K columns so that it may be multiplied by the decoding matrix A'.

The decoding matrix A' is formed by first selecting columns from the network code matrix A that have indices that are the same as the indices of the encoded packets that correspond to the selected received packets. In some embodiments, a sequence number or index may be applied to each received packet (e.g., by being transmitted with the packet) that identifies the column of the transmission matrix Y that the received packet corresponds to. For example, assume a Reed-Solomon (7, 5) code is used and thus there are 7 encoded packets in the transmission matrix Y. Of the 7 encoded packets, the encoded packet in column 5 of the transmission matrix Y does not pass the CRC 118. Thus there are 6 received packets that correspond to encoded packets in the transmission matrix having indices 1, 2, 3, 4, 6 and 7. Then, assume that the received packet selection scheme is to select the first K (i.e., 5 in this case) received packets to generate the received packet matrix. Thus, the selected received packets correspond to encoded packets in the transmission matrix having indices 1, 2, 3, 4 and 6 make up the columns of the received packet matrix.

As a result, columns 1, 2, 3, 4 and 6 of the network code matrix A are selected, since these columns have the same indices as the encoded packets that correspond to the selected received packets in the received packet matrix. Then, the selected columns of the network code matrix A, which result in a K×K matrix, are inverted to form the decoding matrix A'. Further, the arrangement of the selected columns of the network code matrix A in the decoding matrix A' should match the arrangement of the selected received packets in the received packet matrix. For example, if the ordering of the selected received packets is, for some reason, altered to correspond to columns 3, 4, 6, 1 and 2 of the transmission matrix, then the selected columns of the network code matrix A should also be ordered as columns 3, 4, 6, 1 and 2 prior to inversion. One skilled in the art will appreciate that inversion of the sub-matrix of the network code matrix A is possible because a property of the K×K identity matrix taken in combination with columns that describe a Reed-Solomon (N, K) network code is that any subset of K columns will be linearly independent.

Subsequently, the received packet matrix is multiplied by the decoding matrix A' to generate a recovered matrix X'. Each column of the recovered matrix X' corresponds to one of the original K message packets, and thus the original K message packets are received successfully at the receiver 112 despite an encoded packet being lost during transmission from the transmitter 102 to the receiver 112. Additionally, although the above example only suggested one packet was lost during transmission, up to N−K packets may be lost during transmission and the original K message packets are still recoverable by the network decoder 112. Further, although described specifically with respect to a Reed-Solomon (7, 5) code, many other variations of Reed-Solomon networking codes may be employed.

Alternately, in some embodiments all M received packets may be selected. In this case, A' may be generated by taking the pseudo-inverse of the corresponding M columns of the network code matrix A. Thus, the received packet matrix comprises the matrix R, which is L×M; the decoding matrix A' is M×K; and the recovered matrix X' is L×K. As above, each column of the recovered matrix X' corresponds to one of the original K message packets.

In accordance with various embodiments, by preemptively sending a larger number of packets (i.e., N packets) than what is required for successful decoding (i.e., K packets), the PER is reduced and thus retransmission of packets is correspondingly reduced. This provides increased reliability for wireless communications in the system 100. Additionally, as explained above, the network coding scheme may be employed at the network layer so that underlying wireless communications protocols may be maintained without costly modification. However, in alternate embodiments, the network coding scheme may be employed at the MAC 106, 120 with minimal modifications while still taking advantage of already-developed commercial devices that utilize certain wireless communication protocols.

The above-described wireless communication system 100 may be employed to provide a point-to-point link, however is not limited to such links. One example of applications in which increased reliability is important is point-to-point video links, such as those used in vehicular backup cameras where a wired connection is cumbersome or unwarranted. In these cases, it is highly important that the video stream be received reliably without any dropout (i.e., low packet loss and a small number of packet retransmissions). Another example of applications in which increased reliability is important is wireless sensors on a vehicle, such as sensors used to monitor tire pressure, engine temperatures, and other critical system parameters. Another application is wireless video distribution from a set-top box or phone to a TV or monitor. In all of these applications, it is extremely important that the information (e.g., video packets) be delivered reliably and without the need for retransmission.

In some embodiments, if the message packets are not the same length, then pad bits or symbols may be inserted to the message packets to ensure that all of the message packets are of equal length before the encoding process. In some cases, the pad bits or symbols are not required to be transmitted wirelessly as long as the packet lengths are known or conveyed to the receiver 112. Then, at the receiver 112, these pad bits or symbols may be re-inserted before the received packets are passed to the network decoder 122.

FIG. 3 shows a network coding system 300 in accordance with various embodiments. The network coding system 300 includes a packet encoding engine 302 and a packet decoding engine 304. In addition, a packet repository 306 may be coupled to the engines 302, 304. The packet encoding engine 302 and the packet decoding engine 304 are combinations of programming and hardware to execute the programming. Although shown separately, the packet encoding engine 302 and the packet decoding engine 304 are not required to represent separate pieces of software programming. For example, each engine 302, 304 may share a common processor and memory, although this is not required. Additionally, the programming that enables the functionality of each engine 302, 304 may be included in the same executable file or library.

The packet encoding engine 302 receives message packets that contain data to be transmitted from, for example, a higher-layer application executing on the transmitter 102. The message packets may be received from the packet repository 306. The packet encoding engine 302 also encodes the message packets to produce a number of encoded packets greater than the number of message packets. As explained above, the length of the message packets is preserved when encoded to produce the encoded packets, and thus the encoded packets are suitable for subsequent transmission (e.g., by the PHY 108) using an underlying wireless communication protocol of a transmitter. In accordance with various embodiments, the packet encoding engine 302 encodes the message packets by applying a Reed-Solomon code to corresponding symbols of the message packets to produce a corresponding symbol in the parity packets. The packet encoding engine 302 performs the encoding process as is described above with respect to FIGS. 1 and 2a.

The packet decoding engine 304 receives a number of received packets. The packet decoding engine 304 may also receive an erasure packet or erasure signal (e.g., from a CRC 118) that indicates one or more transmitted encoded packets were not received successfully. The received packets and/or the erasure packets may be at least temporarily stored at the packet repository 306. Similar to above, the packet decoding engine 304 selects a number of received packets equal to the number of original message packets (i.e., K received packets) to form columns of a received packet matrix. The packet decoding engine 304 generates a decoding matrix by forming a sub-matrix by selecting columns of a network code matrix (e.g., a matrix used by the packet encoding engine 302 to encode message packets prior to their transmission) that have indices that are the same as the indices of the encoded packets that correspond to the selected received packets. Then, the packet decoding engine 304 inverts the sub-matrix to form the decoding matrix. Finally, the packet decoding engine 304 multiplies the received packet matrix by the decoding matrix to generate a recovered matrix where each column corresponds to a decoded packet. This is similar to the decoding process as described above with respect to FIGS. 1 and 2*b*.

FIG. 4 shows another example of a network coding system 400 in accordance with various embodiments. The network coding system 400 includes a memory resource 402 coupled to a processing resource 404. The processing resource 404 is one or more local or distributed processors. The memory resource 402 includes one or more local or distributed memory devices and comprises a packet encoding module 406 and a packet decoding module 408. Thus, the memory resource 402 and the processing resource 404 are hardware components of the system 400.

Each module 406, 408 represents instructions that, when executed by the processing resource 404, implement an associated engine. For example, when the packet encoding module 406 is executed by the processing resource 404, the above-described packet encoding engine 302 functionality is implemented. Similarly, when the packet decoding module 408 is executed by the processing resource 404, the above-described packet decoding engine 304 functionality is implemented. The modules 406, 408 may also be implemented as an installation package or packages stored on the memory resource 402, which may be a CD/DVD or a server from which the installation package may be downloaded. Additionally, in some embodiments, the above-described functionality may be implemented in an application-specific integrated circuit (ASIC), a combination of an ASIC and software, or an application-specific instruction-set processor (ASIP).

FIG. 5*a* shows a method 500 for network coding in accordance with various embodiments. The method 500 may be performed by, for example, a hardware processor of the transmitter 102 or the receiver 112. The method 500 begins in block 502 with receiving a plurality of message packets. The message packets may be received from, for example, a higher-layer application executing on the transmitter 102. The method 500 continues in block 504 with encoding the message packets to produce a plurality of encoded packets comprising the message packets and one or more parity packets. In accordance with various embodiments, the message packets are encoded by applying a Reed-Solomon code to corresponding symbols of the message packets to produce a corresponding symbol in the parity packets. Subsequently, the encoded packets may be sent to the PHY 108 (e.g., via the MAC 106) for wireless transmission.

FIG. 5*b* shows the encoding step of block 504 in greater detail 550. In some embodiments, the encoding step in block 504 may further comprise generating a message matrix, where each column of the message matrix corresponds to one of the message packets and each element in a column corresponds to one of the symbols of that message packet (block 552). The encoding step in block 504 may also comprise generating a network code matrix to apply the Reed-Solomon code to the message matrix (block 554), for example as described above with respect to FIGS. 1 and 2*a*. Finally, the encoding step in block 504 may include multiplying the message matrix by the network code matrix to generate a transmission matrix (block 556). Each column of the transmission matrix corresponds to an encoded packet, which may be subsequently wirelessly transmitted.

Referring back to FIG. 5*a*, in some embodiments the method 500 may also include, as in block 506, receiving a number of received packets at least equal to the number of message packets. The received packets each correspond to one of the transmitted encoded packets. The method 500 may further continue in block 508 with generating a received packet matrix by selecting a number of the received packets equal to the number of message packets (i.e., K received packets) and using the selected received packets as columns in the received packet matrix. The method 500 may then continue in block 510 with generating a decoding matrix by forming a sub-matrix by selecting columns of the network code matrix that have indices that are the same as the indices of the encoded packets that correspond to the selected received packets and inverting the sub-matrix. This is similar to the decoding matrix generation described above with respect to FIGS. 1 and 2*b*. Finally, the method 500 may continue in block 512 with multiplying the received packet matrix by the decoding matrix to generate a recovered matrix, where each column of the recovered matrix corresponds to a decoded packet.

The above discussion is meant to be illustrative of the principles and various embodiments of the present invention. Numerous variations and modifications will become apparent to those skilled in the art once the above disclosure is fully appreciated. For example, although generally described as applying systematic Reed-Solomon codes, certain embodiments may alternately employ non-systematic Reed-Solomon codes. Additionally, although described as a matrix-based implementation, this is done for ease of explanation; the above coding scheme may be implemented in other ways, such as the use of linear feedback shift registers, or other methods. Further, although described generally with respect to wireless communications, the above Reed-Solomon linear network coding scheme may be utilized in other communication systems, such as wired systems or powerline communication (PLC) systems. It is intended that the following claims be interpreted to embrace all such variations and modifications.

What is claimed is:

1. A method for network coding, comprising: encoding, by a processor, a plurality of message packets to produce a plurality of encoded packets;
   wherein each message packet and each encoded packet comprises a plurality of symbols having an index;
   wherein each symbol of the encoded packets is generated by applying a Reed-Solomon code to the symbols of the message packets having the same index as the symbol of the encoded packets;
   wherein a length of the encoded packets is the same as a length of the message packets;
   wherein the encoded packets comprise the message packets and one or more parity packets;
   wherein each symbol of the parity packets is generated by applying a Reed-Solomon code to the symbols of the message packets having the same index as the symbol of the parity packets and
   sending by the processor the resulting encoded packets to a physical layer of a wireless transmitter for wireless transmission using an existing underlying wireless communication protocol without modification.

2. The method of claim 1 wherein the method is performed at a network layer of a wireless transmitter.

3. The method of claim 1 further comprising, prior to encoding, adding pad symbols to one or more of the message packets such that a length of each message packet is the same.

4. The method of claim 1 wherein the number of message packets and encoded packets are given by a coding rate of the Reed-Solomon code.

5. The method of claim 1 wherein encoding further comprises:
   generating, by the processor, a message matrix wherein each column of the message matrix corresponds to one of the message packets and each element in a column corresponds to one of the symbols of the corresponding message packet;
   generating, by the processor, a network code matrix to apply the Reed-Solomon code to the message matrix; and
   multiplying, by the processor, the message matrix by the network code matrix to generate a transmission matrix, wherein each column of the transmission matrix corresponds to an encoded packet for wireless transmission.

6. The method of claim 5 further comprising:
   receiving, by the processor, a number of received packets at least equal to the number of message packets, each of the received packets comprising a sequence index that correlates the received packet to one of the encoded packets;
   generating, by the processor, a received packet matrix by selecting a number of the received packets equal to the number of message packets, wherein each column of the received packet matrix corresponds to one of the selected received packets;
   generating, by the processor, a decoding matrix by forming a sub-matrix by selecting columns of the network code matrix that have indices that are the same as the sequence indices of the selected received packets and inverting the sub-matrix; and
   multiplying, by the processor, the received packet matrix by the decoding matrix to generate a recovered matrix, wherein each column of the recovered matrix corresponds to a decoded packet.

7. A non-transitory computer-readable medium containing instructions that, when executed by a processor, cause the processor to:
   encode a plurality of message packets to produce a plurality of encoded packets;
   wherein each message packet and each encoded packet comprises a plurality of symbols having an index;
   wherein each symbol of the encoded packets is generated by applying a Reed-Solomon code to the symbols of the message packets having the same index as the symbol of the encoded packets;
   wherein a length of the encoded packets is the same as a length of the message packets;
   wherein the encoded packets comprise the message packets and one or more parity packets;
   wherein each symbol of the parity packets is generated by applying a Reed-Solomon code to the symbols of the message packets having the same index as the symbol of the parity packets and
   wherein executing the instructions further causes the processor to send the encoded packets to a physical layer of a wireless transmitter for wireless transmission.

8. The non-transitory computer-readable medium of claim 7 wherein executing the instructions further causes the processor to, prior to encoding, add pad symbols to one or more of the message packets such that a length of each message packet is the same.

9. The non-transitory computer-readable medium of claim 7 wherein the number of message packets and encoded packets are given by a coding rate of the Reed-Solomon code.

10. The non-transitory computer-readable medium of claim 7 wherein executing the instructions further causes the processor to:
    generate a message matrix wherein each column of the message matrix corresponds to one of the message packets and each element in a column corresponds to one of the symbols of the corresponding message packet;
    generate a network code matrix to apply the Reed-Solomon code to the message matrix;
    multiply the message matrix by the network code matrix to generate a transmission matrix, wherein each column of the transmission matrix corresponds to an encoded packet for wireless transmission.

11. The non-transitory computer-readable medium of claim 10 wherein executing the instructions further causes the processor to:
    receive a number of received packets at least equal to the number of message packets, each of the received packets comprising a sequence index that correlates the received packet to one of the encoded packets;
    generate a received packet matrix by selecting a number of the received packets equal to the number of message packets, wherein each column of the received packet matrix corresponds to one of the selected received packets;
    generate a decoding matrix by forming a sub-matrix by selecting columns of the network code matrix that have indices that are the same as the sequence indices of the selected received packets and inverting the sub-matrix;
    multiply the received packet matrix by the decoding matrix to generate a recovered matrix, wherein each column of the recovered matrix corresponds to a decoded packet.

12. A wireless communication device, comprising: a network encoder to:
    encode a plurality of message packets to produce a plurality of encoded packets;
    wherein each message packet and each encoded packet comprises a plurality of symbols having an index;
    wherein each symbol of the encoded packets is generated by applying a Reed-Solomon code to the symbols of the message packets having the same index as the symbol of the encoded packets;
    wherein a length of the encoded packets is the same as a length of the message packets;
    wherein the encoded packets comprise the message packets and one or more parity packets;
    wherein each symbol of the parity packets is generated by applying a Reed-Solomon code to the symbols of the message packets having the same index as the symbol of the parity packets and
    a physical layer to transmit the encoded packets via a wireless antenna and sending by the network encoder the resulting encoded packets to a physical layer of a wireless transmitter for wireless transmission using an existing underlying wireless communication protocol without modification.

13. The wireless communication device of claim 12 wherein the network encoder comprises a network layer of a wireless transmitter.

14. The wireless communication device of claim 12 wherein the network encoder, prior to encoding, adds pad symbols to one or more of the message packets such that a length of each message packet is the same.

15. The wireless communication device of claim 12 wherein the number of message packets and encoded packets are given by a coding rate of the Reed-Solomon code.

16. The wireless communication device of claim 12 wherein the network encoder is further to:
    generate a message matrix wherein each column of the message matrix corresponds to one of the message packets and each element in a column corresponds to one of the symbols of the corresponding message packet;
    generate a network code matrix to apply the Reed-Solomon code to the message matrix;
    multiply the message matrix by the network code matrix to generate a transmission matrix, wherein each column of the transmission matrix corresponds to an encoded packet for wireless transmission.

17. A wireless communication device, comprising: a physical layer to receive a plurality of encoded packets via a wireless antenna, the encoded packets resulting from encoding a number of message packets by applying a network code matrix to the message packets; and a network decoder to:
    receive a number of received packets at least equal to the number of message packets, each of the received packets comprising a sequence index that correlates the received packet to one of the encoded packets; and
    generate a received packet matrix by selecting a number of the received packets equal to the number of message packets, wherein each column of the received packet matrix corresponds to one of the selected received packets;
    generate a decoding matrix by forming a sub-matrix by selecting columns of the network code matrix that have indices that are the same as the sequence indices of the selected received packets and inverting the sub-matrix;
    multiply the received packet matrix by the decoding matrix to generate a recovered matrix, wherein each column of the recovered matrix corresponds to a decoded packet and
    sending the resulting decoded packets to a higher-layer application of a wireless receiver without the need for retransmission using an existing underlying wireless communication protocol without modification.

* * * * *